United States Patent
Mizoguchi

(10) Patent No.: US 7,713,764 B2
(45) Date of Patent: May 11, 2010

(54) METHOD FOR MANUFACTURING SEMICONDUCTOR DEVICE INCLUDING TESTING DEDICATED PAD AND PROBE CARD TESTING

(75) Inventor: Osamu Mizoguchi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/320,263

(22) Filed: Jan. 22, 2009

(65) Prior Publication Data

US 2010/0009473 A1 Jan. 14, 2010

(30) Foreign Application Priority Data

Jul. 10, 2008 (JP) ............................. 2008-180610

(51) Int. Cl.
*H01L 21/66* (2006.01)
*H01L 21/44* (2006.01)
*H01L 21/48* (2006.01)
*H01L 21/4763* (2006.01)

(52) U.S. Cl. ..................... 438/15; 438/126; 438/622

(58) Field of Classification Search .................. 438/15, 438/126, 622; 257/E25.006
See application file for complete search history.

(56) References Cited

U.S. PATENT DOCUMENTS

| 5,534,784 | A | 7/1996 | Lum et al. | |
|---|---|---|---|---|
| 2008/0272794 | A1* | 11/2008 | Grube et al. | 324/754 |

FOREIGN PATENT DOCUMENTS

| JP | 7-301642 | 11/1995 |
|---|---|---|
| JP | 2003-68736 | 3/2003 |
| JP | 2003-347482 | 12/2003 |
| JP | 2004-022664 | 1/2004 |
| JP | 2004-311535 | 11/2004 |
| JP | 2005-252230 | 9/2005 |
| JP | 2006-278374 A | 10/2006 |

OTHER PUBLICATIONS

Japanese Office Action dated Jun. 9, 2009, with English translation.
Japanese Office Action dated Mar. 10, 2009 with Partial English-Language Translation.

* cited by examiner

*Primary Examiner*—William M. Brewster
(74) *Attorney, Agent, or Firm*—McGinn IP Law Group, PLLC

(57) ABSTRACT

A method for manufacturing a semiconductor device includes preparing two substrates having a first and a second surface and having first and second pads and a second testing-dedicated pad, the first pads in the first surface, the second pads in the second surface and arranged with an inter-pad distance that is larger than that for the first pad, and the second testing-dedicated pad being in the second surface; coupling a wafer with a apparatus, and inspecting the wafer with a probe card, the wafer having a LSI, which is an object of an inspection, the apparatus applicable signal to the LSI formed in the wafer, and measurable electrical characteristics of the LSI formed in the wafer, and the probe card having one of the two substrates; dicing the wafer into semiconductor elements containing the LSI; and packaging the semiconductor element over the other of the two substrates.

3 Claims, 8 Drawing Sheets

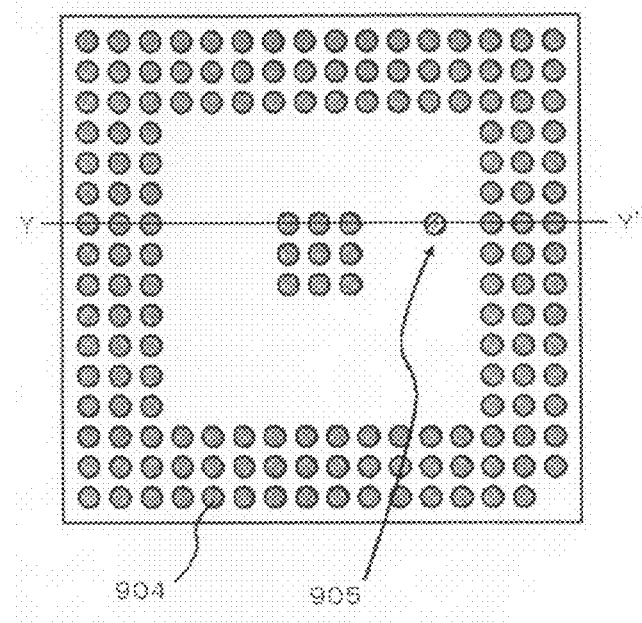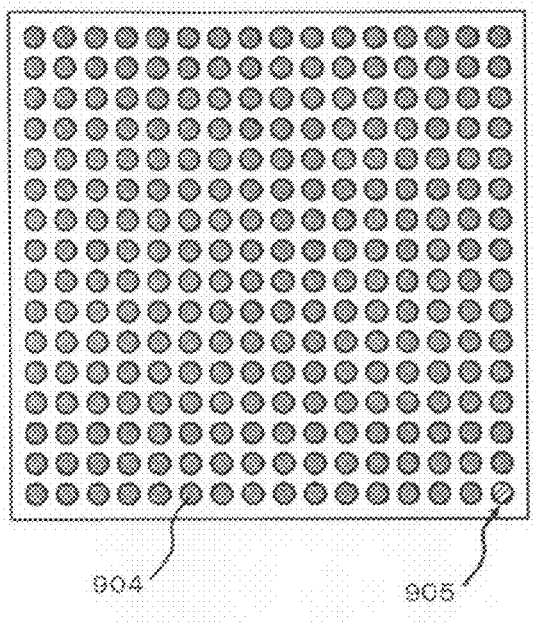

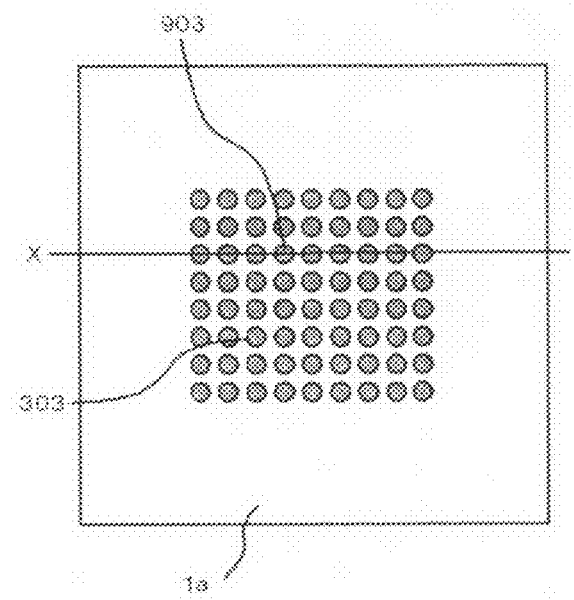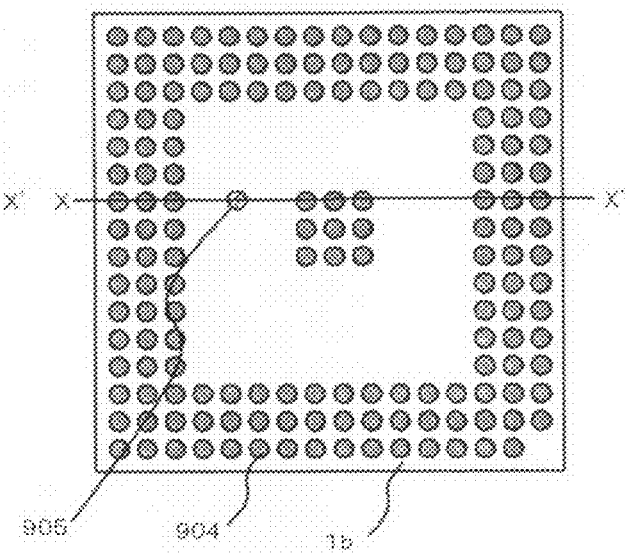

METHOD FOR MANUFACTURING SEMICONDUCTOR DEVICE INCLUDING TESTING DEDICATED PAD AND PROBE CARD TESTING

The present application is based on Japanese patent application No. 2008-180,610, the content of which is incorporated hereinto by reference.

BACKGROUND

1. Technical Field

The present invention relates to a method for manufacturing the semiconductor device and a semiconductor device manufactured by such process.

2. Related Art

In recent years, high-density installation in a semiconductor device requires an increased number of lands disposed in one chip. In particular, configurations of flip-chip devices are advantageous for achieving an arrangement of larger number of lands, since such configurations allow installing lands in array-like patterns in both the periphery of the semiconductor device and additionally the entire surface of the semiconductor device.

In such flip-chip devices, bumps are formed by printing, vapor deposition, plating processes or the like on the lands, which is formed on the semiconductor element via a semiconductor process. A dicing process is conducted for the obtained product, and then the diced products are installed on the package substrate via a reflow soldering process to complete the production of the device.

An operability of a semiconductor device for a desired operation is required to be checked in a wafer-condition.

A large scale integration (LSI) tester is a device for applying electrical signal to a semiconductor element in a wafer-condition and determining whether the signal from the semiconductor element is a desired signal or not. A probe card is a tool utilized between a LSI tester and a semiconductor element and serves as transferring electrical signal. A probe card typically includes a probe card board for providing a coupling with a LSI tester and probes for providing contacts with lands on the semiconductor wafer.

In the case of the flip-chip device, the probes are required to be arranged in a probe card board in an array-like pattern with the same spacing as the spacing for the lands in the semiconductor wafer. In addition, larger number of lands causes narrower inter-pad distance. When a testing of a semiconductor wafer for such flip-chip device is conducted, electric contacts are assured by pushing the probes over bumps formed in the lands in the semiconductor wafer.

The coupling terminals that provide coupling to the LSI tester are required to be arranged around the circumference of the surface of the probe card board at predetermined spacing. In addition, the coupling terminals that provide coupling to the probes are required to be arranged around the center of the back surface of the probe card board in the same arrangement as employed for the lands on the semiconductor wafer. Therefore, it is concluded that, when the inter-probe distance or probe spacing is different from the inter-terminal distance or terminal spacing for the coupling terminals in the LSI tester, it is necessary to provide a matching of the spacing in the probe card board.

To solve the problem, either a wiring-system or an adapter board-system is employed for converting the spacing.

In the wiring-system, wires are laced through the board, which includes through holes corresponding to the spacing of the land pads in the semiconductor element, and the wires are cut and polished in the back surface of the board, and the cut surfaces of the wires are employed as the land pads in the side of the probes. The other ends of the wires are connected to the probe card board to obtain the coupling between the LSI tester and the probe.

In the case of employing the wiring system, all the procedures for electric wirings are made by manual works of workers. Limited number of electric wirings is available in the wiring system by such reasons, and more specifically the upper limit would be about 2,000 pins.

Therefore, when more pads are required, the use of the adapter board system is required. In order to manufacture land pads that accommodate narrower inter-pad distance of several hundred micrometers, ceramic boards or built-up boards are generally employed for the base material in the adapter board system. The set of the land pads are formed in the side of the back surface of the adapter board at the same inter-pad distance as employed in the semiconductor element, and the other set of the land pads are formed in the side of the front surface thereof at the inter-pad distance of about 1 mm, and wiring couplings are made between the set of land pads in the side of the back surface and the set of the land pads in the side of the front surface in the inside of the adapter board.

However, according to the adapter board system, new adapter board dedicated for the product must be designed in accordance with the arrangement of the pads specified for the product. Ceramics boards and the built-up boards, which are the materials for the base material in the adapter board system, are expensive, and therefore the adapter board system is not advantageous in terms of the cost.

To solve the problem, a technology employing the package substrate of the device as the adapter board has been developed, as described in Japanese Patent Laid-Open No. H07-301642 (1995). This allows reducing the cost for every device. FIG. 8 is a diagram, illustrating an exemplary implementation that employs a package substrate for an adapter board.

However, even if the configuration for utilizing the product package substrate of the object device is adopted as an adapter board as typically described in Japanese Patent Laid-Open No. H07-301642 (1995), the configuration further needs to be improved.

The adapter board is required to have a testing-dedicated terminal (testing-dedicated pads). The testing-dedicated pad is a dedicated terminal, which is essential for applying specified electrical signal from a LSI tester, when an LSI testing is conducted for an LSI formed in the semiconductor wafer. On the other hand, no terminals dedicated for the testing is required in the package substrate having a semiconductor device installed therein. Therefore, a direct utilization of the package substrate for the adapter board cannot achieve the LSI testing.

To solve the problem, wiring of the testing-dedicated pad on the package substrate is considered. Typical semiconductor packages having testing-dedicated pads are described in Japanese Patent Laid-Open No. 2003-347,482 and Japanese Patent Laid-Open No. 2004-022,664.

However, Japanese Patent Laid-Open No. 2003-347,482 merely discloses a configuration having a testing-dedicated pad provided only in the upper surface of the semiconductor package, and coupled to the semiconductor chip, and no package substrate testing-dedicated pad is provided in the configuration disclosed in Japanese Patent Laid-Open No. 2003-347,482. Further, no inter-pad distance conversion for the land pads is considered in the disclosure of Japanese Patent Laid-Open No. 2004-022,664. Therefore, the package substrate cannot be utilized for the adapter board for inspection that is employed for the conversion of the inter-pad distances in the above-described technologies disclosed in Japanese Patent Laid-Open No. 2003-347,482 and Japanese Patent Laid-Open No. 2004-022,664.

Further, if the semiconductor package is to be installed on a mother board, it is necessary to provide an external coupling terminal such as a solder bump and the like in a surface of opposite to the surface for installing the semiconductor element of the package substrate. However, when the terminals dedicated for the testing is wired on the package substrate, the presence of the solder bumps coupled on the testing-dedicated pad for the external coupling terminal may possibly limit flexibility for designing the mother board in the product having the package substrate installed therein.

SUMMARY

According to one aspect of the present invention, there is provided a method for manufacturing a semiconductor device, preparing two package substrates having a first surface and a second surface and having a plurality of first land pads, second land pads and a second testing-dedicated pad, the first land pads being disposed in the first surface, the second land pads being disposed in the second surface and arranged with an inter-pad distance that is larger than an inter-pad distance for the first land pad, and the second testing-dedicated pad being disposed in the second surface; electrically coupling a semiconductor wafer with a measuring apparatus, and inspecting the semiconductor wafer with a probe card, the semiconductor wafer having a large scale integrated circuit (LSI), which is an object of an inspection, the measuring apparatus being capable of applying electrical signal to the LSI formed in the semiconductor wafer, and capable of measuring electrical characteristics of the LSI formed in the semiconductor wafer, and the probe card having one of the prepared two package substrates; dicing the semiconductor wafer into semiconductor elements containing the LSI; and packaging the semiconductor element over the other of the prepared two package substrates, wherein the probe card includes the one of the package substrates, external coupling terminals provided in the second land pads and the second testing-dedicated pads of the one package substrate and electrically coupled to the measuring apparatus, and probes, being electrically coupled to the plurality of first land pads included in the one package substrate and being in contact with the lands formed in the semiconductor wafer, wherein the inspecting the semiconductor wafer includes: electrically coupling the plurality of first land pads to the lands provided in the semiconductor wafer by causing the probes of the probe card into contact with the lands provided in the semiconductor wafer; and applying electrical signal from the measuring apparatus to the semiconductor wafer to measure electrical characteristics of the semiconductor wafer, and wherein the packaging the semiconductor element includes installing the semiconductor element over the first surface of the other package substrate and providing electrical coupling of the semiconductor element with the first land pad of the other package substrate; and forming an external coupling terminal over the second land pad of the other one of the package substrates, without forming an external coupling terminal over the second testing-dedicated pad of the other one of the package substrates.

According to another aspect of the present invention, there is provided a semiconductor device, comprising: a package substrate having a first surface and a second surface; and a semiconductor element installed in the first surface of the package substrate, wherein the package substrate includes a plurality of first land pads disposed in the first surface, second land pads disposed in the second surface, and a second testing-dedicated pad disposed in the second surface, and wherein the semiconductor element is electrically coupled to the first land pads, wherein an inter-pad distance for the second land pads is larger than an inter-pad distance for the first land pads, wherein the second land pad is provided with an external coupling terminal, and wherein no external coupling terminal is provided in the second testing-dedicated pad.

According to the above-described aspect of the present invention, the second land pads and the second testing-dedicated pad are included in the second surface of the package substrate having the semiconductor element installed therein. This allows providing a coupling between the coupling terminal and the second testing-dedicated pad before installing the semiconductor element, thereby achieving a utilization of the package substrate for an adapter board for the LSI testing. In addition, the present invention is configured that an external coupling terminal is provided for the second land pads and no external coupling terminal is provided for the second testing-dedicated pad. Having such configuration, unwanted electrical contact of the second testing-dedicated pad with a mother board can be avoided, even if the mother board is installed in the second surface. Therefore, the package substrate can be utilized for the adapter board while a malfunction of a semiconductor device is prevented, without limiting flexibility of design for the mother board. Thus, the semiconductor elements in the wafer condition can be inspected with lower cost and higher adequacy.

In addition, various types of components of the present invention are not necessary to be respectively independent objects, and a plurality of components may be presented to form a single member, a single component may be formed of a plurality of members, a certain component may form a portion of another component, or a portion of a certain component may compose a portion of the other component.

According to the present invention, a package substrate can be utilized for an adapter board, without limiting flexibility of design for the mother board. Therefore, semiconductor devices, which have been appropriately inspected in the electrical characteristics via an adapter board system, can be installed to the board, and the quality of the semiconductor device can be stabilized at lower production cost.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 2A and 2B are plan views, schematically illustrating a semiconductor device according to an embodiment;

FIGS. 5A and 5B are plan views, schematically illustrating an adapter board according to an embodiment;

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations according to the present invention will be described in detail as follows in reference to the annexed figures. In all figures, an identical numeral is assigned to an element commonly appeared in the figures, and the detailed description thereof will not be repeated.

Figure 1A:
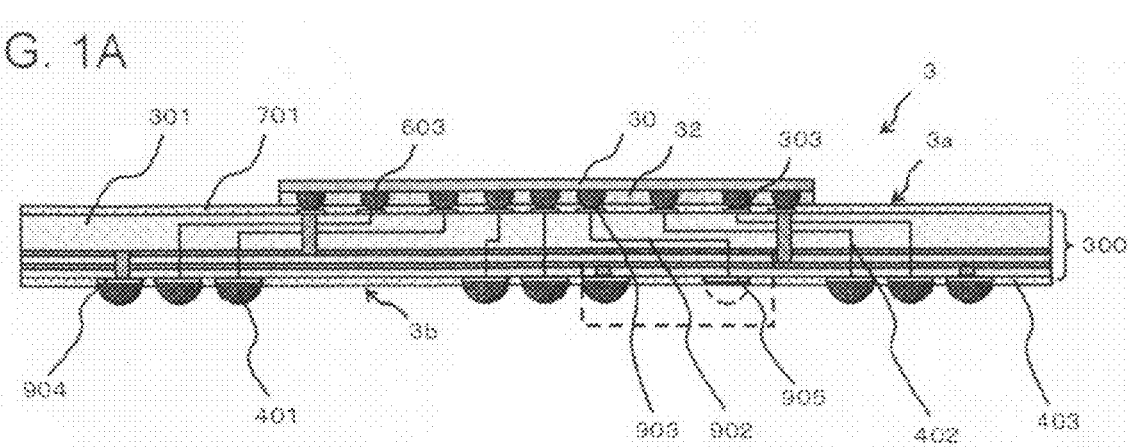
FIGS. 1A and 1B are cross-sectional views, schematically illustrating a semiconductor device according to an embodiment of the present invention.
Figure 1B:
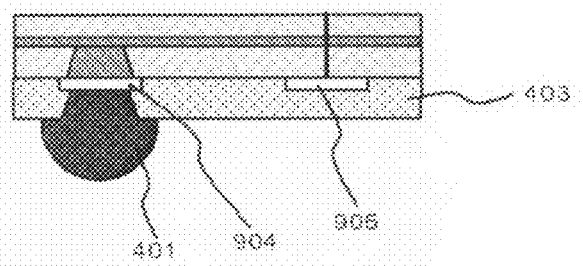

FIGS. 2A and 2B are plan view, schematically illustrating a semiconductor device 3 of the present embodiment. FIGS. 1A and 1B are cross-sectional views of FIG. 2A along line Y-Y'. FIG. 1B is a diagram of an enlarged view of a portion surrounded by a dotted line shown in FIG. 1A. The semiconductor device 3 of the present embodiment includes a package substrate 300 having a first surface (device side 3a in FIG. 1A) and a second surface (bump side 3b in FIG. 1A), and a semiconductor element 30 installed in the device side 3a of the package substrate 300. The package substrate 300 includes pads 303 (first land pads) disposed in the device side 3a, a testing-dedicated pad 903 (first testing-dedicated pad), pads 904 (second land pads) disposed in the bump side 3b, and a testing-dedicated pad 905 (second testing-dedicated pad) disposed in the bump side 3b. The semiconductor device 30 is electrically coupled to each of the pads 303 and the testing-dedicated pad 903. External coupling terminals 401 are provided in the pads 904, and none of the external coupling terminal 401 is provided in the testing-dedicated pad 905. An inter-pad distance for the pads 904 is larger than an inter-pad distance for the pads 303.

The semiconductor device 3 may be manufactured by the following procedures.

Figure 3A:
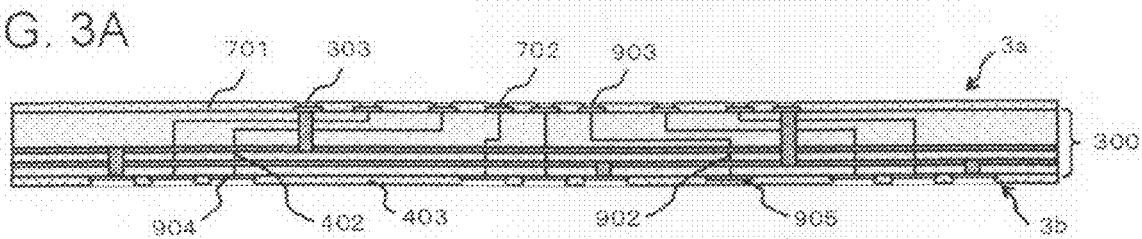
FIGS. 3A to 3D are diagrams, useful in describing a method for manufacturing a semiconductor device according to an embodiment.

(1) An operation for preparing two package substrates 300 as shown in FIG. 3A.

One is a package substrate for a probe card-installation, and the other is a package substrate for a semiconductor device-installation.

Figure 6:
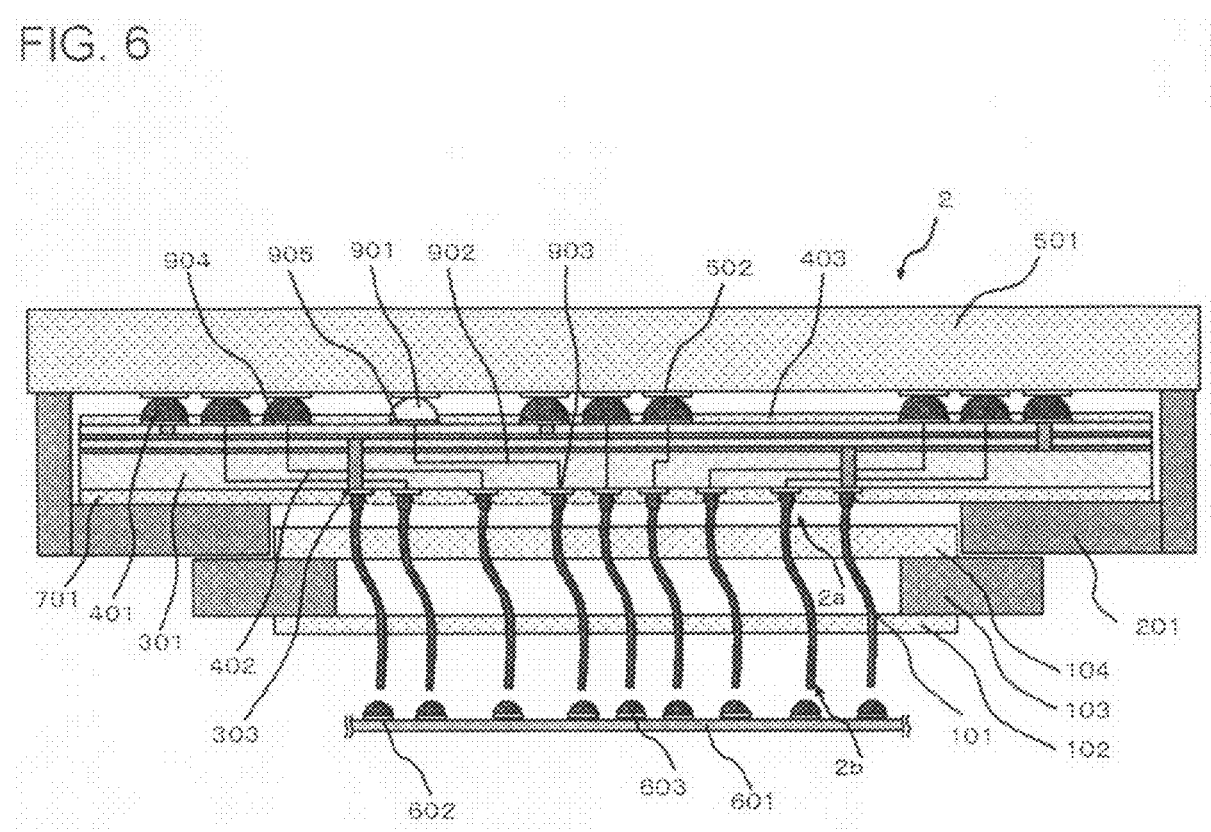
FIG. 6 is a cross-sectional view, schematically illustrating a probe card according to an embodiment.

(2) An operation for electrically coupling a semiconductor wafer 601 with a measuring apparatus (not shown), which is capable of applying electrical signal to a large scale integrated circuit (LSI) formed in the semiconductor wafer 601 serving as an object of an inspection, and is capable of measuring electrical characteristics of the LSI formed in the semiconductor wafer 601, and inspecting the semiconductor wafer 601 with a probe card 2 that has the package substrate for the probe card, as shown in FIG. 6.

(3) An operation for dicing the semiconductor wafer into the semiconductor devices containing the LSIs.

Figure 3B:
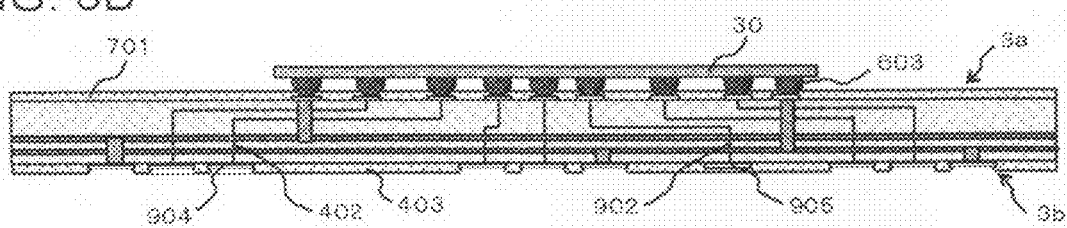
Figure 3C:
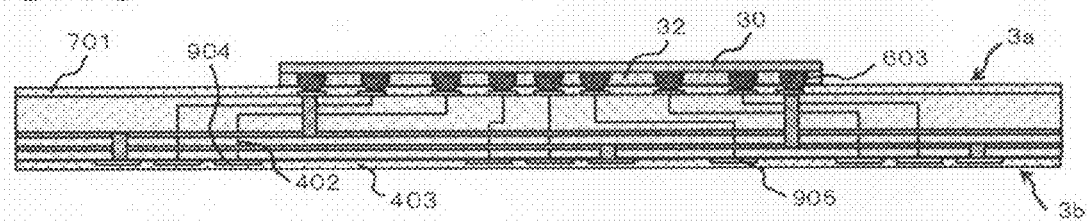
Figure 3D:
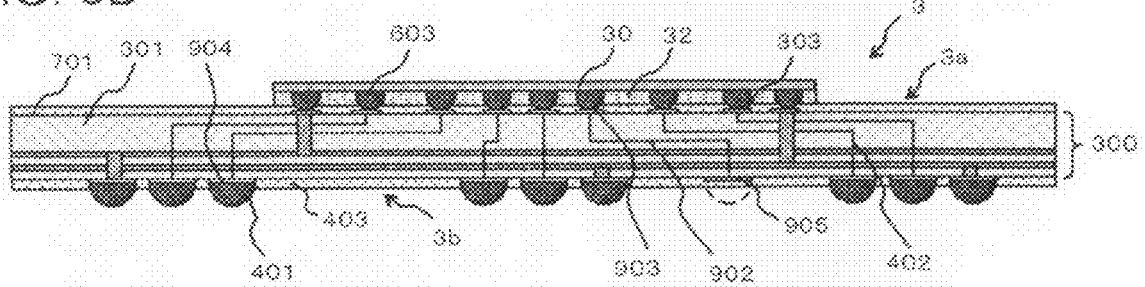

(4) An operation for packaging the semiconductor device 30 on the package substrates 300 for installing the semiconductor element as shown in FIGS. 3B to 3D.

The probe card 2 includes, as shown in FIG. 6, the package substrate for the probe card, the external coupling terminal 401 provided in the pad 904 of the package substrate for the probe card and electrically coupled to the measuring apparatus, the external coupling terminal 901 provided in the testing-dedicated pad 905 of the package substrate for the probe card and electrically coupled to the measuring apparatus, and the probes 101 electrically coupled to each of the pads 303 and the testing-dedicated pad 903 included in the package substrate 300 for the probe card, and in contact with the lands 602 formed in the semiconductor wafer 601.

The above-described operation (2) for inspecting the semiconductor wafer further includes the following operations.

(2-1) An operation for electrically coupling the pads 303 and the testing-dedicated pads 903 with the lands 602 provided in the semiconductor wafer 601, respectively, by causing the probes 101 of the probe card 2 to be in contact with the lands 602 provided in the semiconductor wafer 601.

(2-2) An operation for measuring the electrical characteristics of the semiconductor wafer 601 by applying electrical signal to the semiconductor wafer 601 from the measuring apparatus.

The above-described operation (2) for inspecting the semiconductor wafer includes, more specifically, an operation for applying specified electrical signal from the measuring apparatus to the lands 602 in the semiconductor wafer 601 through the testing-dedicated pad 905, the wirings 902, the testing-dedicated pad 903 and the probes 101.

The above-described operation (4) for packaging the semiconductor device further includes the following operations.

(4-1) An operation for installing the semiconductor element 30 on the first surface (device side 3a in FIG. 3) of the package substrate 300 for installing the semiconductor element, and electrically coupling the semiconductor element 30 with the pads 303 of the package substrate 300 for installing the semiconductor device and the testing-dedicated pads 903, respectively, as shown in FIG. 3B.

(4-2) An operation for injecting an underfill resin 32 into the gap between the semiconductor element 30 and the resist 701, as shown in FIG. 3C.

(4-3) An operation for forming the external coupling terminals 401 on the pads 904 of the package substrate 300 for installing the semiconductor device while no external coupling terminal is formed on the testing-dedicated pad 905 of the package substrate 300 for installing the semiconductor device, as shown in FIG. 3D.

Hereinafter, the semiconductor device 3 and the method for manufacturing thereof will be described in detail.

The semiconductor device 3, as shown in FIG. 1, has the device side 3a that is covered with the resist 701. The package substrate 300 has a rectangular geometry.

The package substrate 300 may be employed as an adapter board. Thus, the testing-dedicated pad 903 and the associated wiring 902 are previously formed. In addition, while the testing-dedicated pad 905 is installed to the package substrate 300, none of such testing-dedicated pad 905 is employed in the condition after the package assembly. Thus, as shown in FIG. 2A, the testing-dedicated pad 905 is formed in the section without the pad 904. This avoids a need for a change in the layout of the mother board installed in the bump side 3b.

The testing-dedicated pads 903 and 905 may be couple to with a coupling terminal of a testing-dedicated employed by LSI testing. The testing-dedicated pad is a dedicated terminal, which is essential for applying specified electrical signal from a LSI tester, when an LSI testing is conducted for the semiconductor wafer. Thus, the testing-dedicated pad is not utilized in the semiconductor device after installing the semiconductor element 30. Thus, the semiconductor device 3 is configured to have no external coupling terminal 401 installed in the testing-dedicated pad 905. This configuration prevents unwanted contact of the testing-dedicated pad 905 with the mother board, when the mother board is installed in the side of the bump side 3b. Therefore, a change in the design of the mother board such as additionally providing a pad associated with the testing-dedicated pad 905 on the mother board is not required, and thus it is advantageous in the production cost.

The package substrate 300 also internally includes the wirings 402 and 902. The testing-dedicated pad 903 is electrically coupled to the testing-dedicated pad 905 through the wiring 902. The pads 303 are electrically coupled to the pads 904 through the wirings 402.

The semiconductor element 30 is also installed in the device side 3a of the package substrate 300 via the bumps 603. The bumps 603 are necessary for providing the coupling with the probe, when the electrical characteristics of the semiconductor element 30 are inspected in the wafer condition. Even though the bumps may be removed after the completion of the inspection, such removal causes other problems such as increased number of operations, an increased production costs and the like. Thus, it is advantageous to avoid a removal of the bumps 603.

The package substrate 300 may be composed of, for example, a printed package substrate having multiple-layered wiring layers. Various types of resin materials may be employed for composing the board member 301 of the package substrate 300, and for example, glass-epoxy resin may be typically employed.

Copper, nickel or the like may be employed for the material composing the pads 303 and 904. Copper, nickel or the like may also be employed for the material composing the testing-dedicated pads 903 and 905.

FIGS. 2A and 2B are plan views, schematically illustrating the side of the bump side 3b of the semiconductor device. As shown in FIG. 2A, the pads 904 are disposed in the circumference section and the central section of the bump side 3b. A space, which is larger than the inter-pad distance for the pads 904, is formed between the circumference section and the central section. The testing-dedicated pad 905 is provided in such space.

A layout of the pads 904 may alternatively have none of such space as shown in FIG. 2B. In such case, the testing-dedicated pad 905 may be provided in a corner portion of the bump side 3b. The package substrate 300 is configured that the external coupling terminal 401 is not installed only one corner, in order to prevent an incorrect orientation in the installation of the semiconductor element 30. Having such configuration, the testing-dedicated pad 905 can be provided in the corner portion of the bump side 3b.

Having such configuration, the testing-dedicated pad can be disposed in the location where the user does not use. Therefore, the package substrates having the same structure may be employed for the package substrate 300 having installed semiconductor elements and for the adapter board 1 as will be discussed later, and thus the configuration is advantageous in the production cost.

In addition to above, the testing-dedicated pad 905 in the bump side 3b may be covered with an electrically insulating protective film 403. This ensures preventing the testing-dedicated pad 905 from creating a short circuit with the adjacent pads 904. The electrically insulating protective film 403 may be formed of solder resist. The external coupling terminal 401 may be composed of, for example, a solder bump.

The semiconductor device 3 is thus configured to allow the package substrate 300 being utilized as the adapter board for inspection. An example of an adapter board that utilizes the package substrate 300 will be described as follows.

Figure 4A:
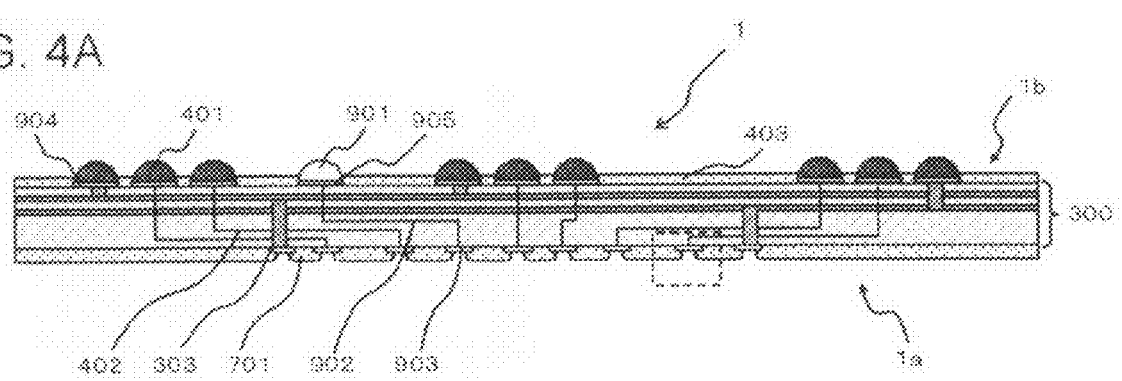
FIGS. 4A and 4B are cross-sectional view, schematically illustrating an adapter board according to an embodiment.
Figure 4B:
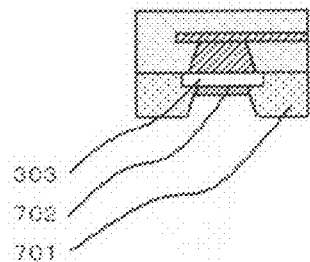

FIGS. 5A and 5B are plan views, which schematically illustrate the adapter board 1. FIGS. 4A and 4B are cross-sectional views of FIG. 5 along line X-X'. The adapter board 1 includes the package substrate 300, and the resist 701 formed in the device side 1a. Solder plating 702 is prepared on the pads 303. The pads 303 are electrically coupled to the pads 904 through the wirings 402. The external coupling terminals 401 are installed on the pads 904.

Further, the adapter board 1 includes the testing-dedicated pad 905 in the bump side 1b of the package substrate 300. The external coupling terminal 901 dedicated for the testing is installed on the testing-dedicated pad 905. The testing-dedicated pad 905 is also electrically coupled to the testing-dedicated pad 903 through the wiring 902. The external coupling terminals 401 and 901 may be composed of, for example, solder bumps.

An exemplary implementation employing the adapter board 1 thus configured will be described in reference to FIG. 6. The probe card 2 provides an electrical coupling of the semiconductor wafer 601, which includes LSIs formed therein serving as objects of the testing, with the measuring apparatus, which is capable of applying electrical signal to the semiconductor wafer 601 to measure the electrical characteristics of the semiconductor wafer 601. The probe card 2 includes the adapter board 1 and the probes 101 that provide electrical couplings to the pads 303 included in the adapter board 1 and are in contact with the lands 602 formed in the semiconductor wafer 601.

The probes 101 are regularly arranged at the spacing equivalent to the spacing between the lands 602 disposed on the semiconductor wafer 601 that is the object of the measurement. The spacing is about 125 μm to 250 μm. A member having a spring-ability and having a diameter of about 30 μm to 120 μm may be employed for the probe 101. Such member is plated with an alloy composed of noble metals or an iron base metal is plated with nickel or gold to obtain the probes 101.

The probe card 2 further includes a probe card board 501.

The probe card board 501 is installed in the side of the bump side 1b of the adapter board 1.

The probe card 2 is a tool for applying signal from an LSI tester to the semiconductor wafer 601 and vice versa. Thus, the spacing between the bumps 603 formed in the semiconductor wafer 601 must be extended to an appropriate spacing that allows the coupling to the LSI tester in the case of the probe card 2. The land poles of the LSI tester have the spacing of about 1 to 2 mm. The LSI tester is directly coupled to the probe card board 501.

A printed package substrate may be employed for the probe card board 501. Such printed circuit board has a circular geometry having a diameter of about 25 cm to 45 cm, or a rectangular geometry having a width of about 25 cm to 45 cm. The probe card board 501 may be manufactured by creating copper-wiring within an organic material such as glass-epoxy resin, polyimide resin and the like.

Coupling terminals 502 coupled to the LSI tester are arranged around the circumference of the surface of the probe card member at an inter-terminal distance of about 1 mm to 2 mm. The inter-pad distance may be converted to about 0.8 mm to 1.27 mm by employing the probe card board 501. Further, the adapter board 1 may be employed to achieve the conversion of the spacing to the same inter-pad distance as employed in the semiconductor wafer 601.

The pads 303 and the testing-dedicated pad 903 are arranged in the side of the device side 1a of the adapter board 1 at the same inter-pad distance as employed in the semiconductor wafer 601.

The pads 904 are arranged in the side of the bump side 1b at the same inter-pad distance as employed for the pads 502 on the probe card board 501. The couplings between the pads 303 and the pads 904 are created via the wirings 402 within the package substrate 300. The electric coupling between the package substrate 300 and the probe card board 501 is achieved by providing electrical couplings of the external coupling terminals 401 and 901 with the coupling terminals 502 via a process such as a reflow soldering process and the like.

Electrical conductions between the adapter board 1 and the probes 101 are achieved by pressing the end sections of the probes 101 (upper end sections 2a in FIG. 6) against the pads 303. The probes 101 are maintained by the guide plates 102 and 104. The guide plates 102 and 104 are provided with openings, each having a diameter slightly larger than the diameters of the probes 101, in the equivalent positions as the probes 101 are located.

The probes are extended through the opening of the board to provide the retention and the alignment of the probes 101.

Here, the combination of the probes 101, the guide plates 102 and 104, and the spacer 103 are generally called as a "probe head". The probe head is employed to be fixed to a plate 201 installed on the probe card board 501 with screws or the like. In such case, the probe is required to be aligned to be fixed so that the positions of the upper end sections 2a of the probes 101 meet the positions of the pads 303 and the testing-dedicated pad 903 on the package substrate 300. Thus, as shown in FIG. 6, it is preferable that the upper end sections 2a of the probes 101 are pressed against the pads 303 and the testing-dedicated pad 903.

Figure 7:
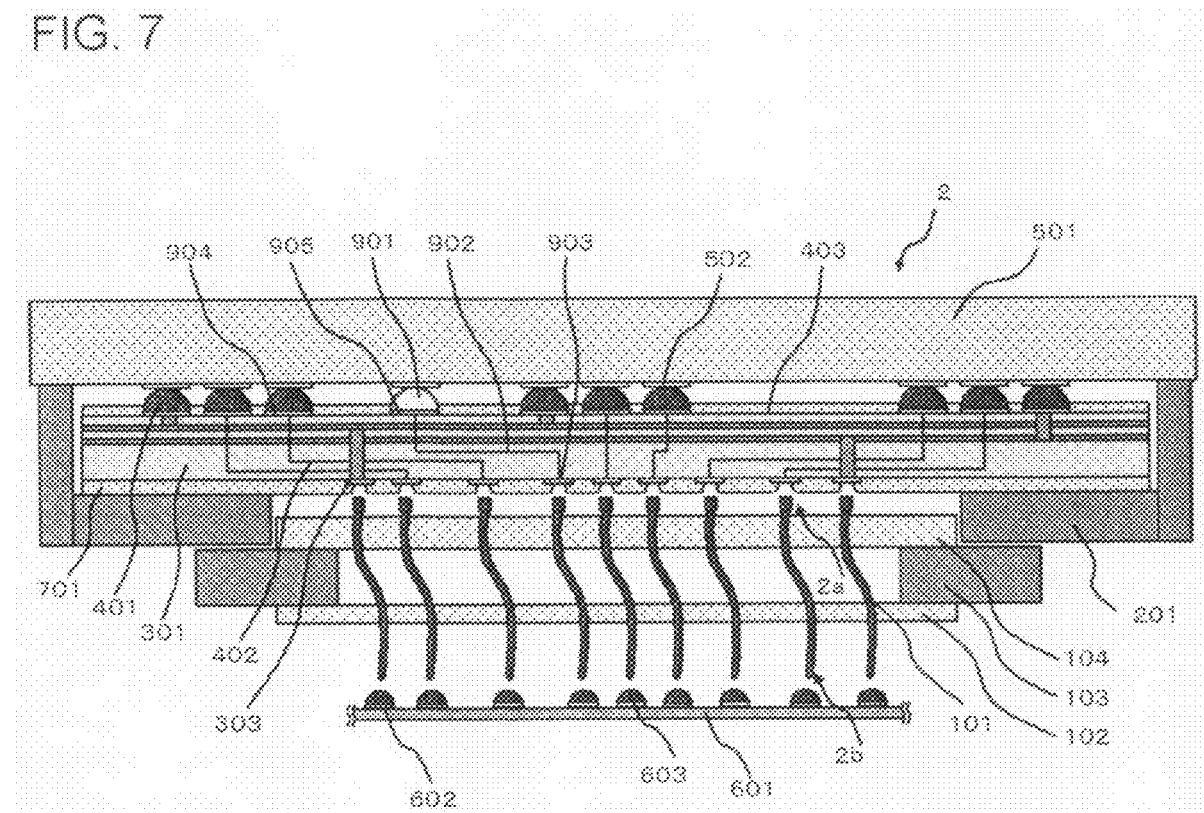
FIG. 7 is a cross-sectional view, schematically illustrating a modified embodiment of a probe card according to an embodiment.
Figure 8:
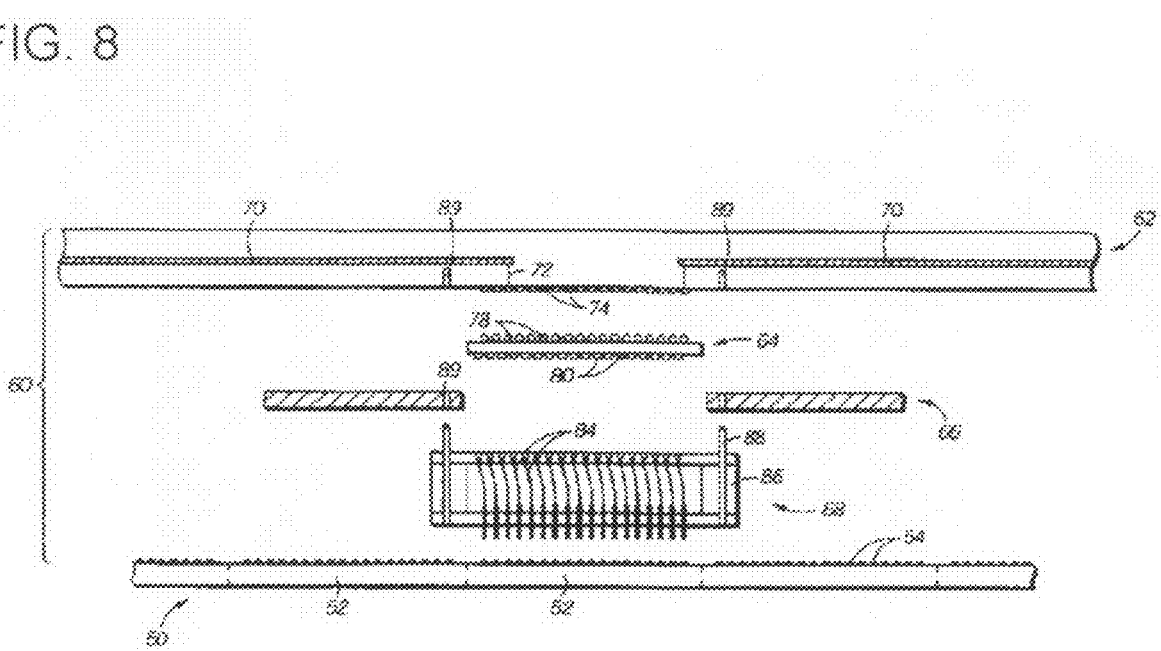
FIG. 8 is a diagram, illustrating an example of a conventional adapter board.

Further, the probe card 2 may be in a floating condition as shown in FIG. 7, before the probes 101 are coupled to the lands in the semiconductor wafer, and may also be electrically coupled to the pads 303 after the probes are coupled to the lands in the semiconductor wafer. Here the "floating condition" means a condition, in which the probes 101 are not pressed against the pads 303.

Subsequently, the method for inspecting the semiconductor wafer 601 employing such probe card 2 will be described. The method for the inspection includes an operation for causing the probes 101 in contact with the lands 602 provided in the semiconductor wafer 601 that is an object for the inspection, and an operation for applying electrical signal to the semiconductor wafer 601 to measure electrical characteristics of the semiconductor wafer 601.

The procedure for conducting such electrical testing will be specifically described as follows. In the following description, a flip-chip device of a wafer condition will be represented as an example of the semiconductor wafer 601.

The probe card 2 is mounted onto an upper surface of a device called prober, and an LSI tester and the probe card 2 are electrically coupled. The semiconductor wafer 601 as an object for the measurement is disposed on a stage of the prober, and alignments in XYZ-directions for the bumps 603 formed on the lands 602 of the semiconductor wafer 601 are conducted over the positions of the end sections of the probes 101 in the probe card (bottom end section 2b in FIG. 6). Then, the stage is lifted up to press the bumps 603 of the semiconductor wafer 601 against the probes 101 of the probe card. When the probes 101 are fixed under the floating condition, the upper end sections 2a of the probes 101 are then pressed against the pads 303 and the testing-dedicated pad 903 to obtain electric conduction. Once such situation is reached, the LSI tester is electrically coupled to the semiconductor wafer 601 through the bumps 603 and the probes 101. This allows achieving inspections by applying/detecting electrical signal to/from the LSI tester.

Subsequently, a procedure for packaging the semiconductor device to manufacture the semiconductor device 3 will be described in reference to FIGS. 3A to 3D. First of all, the package substrate 300 is prepared. The package substrate 300 has a structure that is the same as the package substrate of the adapter board 1. The wirings 402 and 902 are formed in the inside of the board member 301. The pads 303 and the testing-dedicated pad 903 are disposed in a first surface (device side 3a in FIG. 3) of the board member 301, and the pads 904 and the testing-dedicated pad 905 are disposed in a second surface (bump side 3b) of the board member 301.

Subsequently, a solder plating 702 is applied over the pads 303 to form the resist 701 (FIG. 3A). Then, the semiconductor element 30 is installed via a reflow soldering process in the side of the device side 3a of the package substrate (FIG. 3B).

Thereafter, the space between the semiconductor element 30 and the resist 701 are filled with an underfill resin 32 (FIG. 3C). Finally, the external coupling terminals 401 are installed on the pads 904 to provide a finished product of the semiconductor device 3 (FIG. 3D). In addition to above, the testing-dedicated pad 905 has no external coupling terminal 401.

In addition to above, the semiconductor element 30 may be prepared via a semiconductor process. The lands (not shown) of the semiconductor element 30 in a wafer condition are provided with bumps 603 via a printing, a vapor deposition or a plating processes. This is diced into pieces to obtain the semiconductor elements 30 (semiconductor chips). Concerning the semiconductor elements 30, the selected semiconductor devices having the LSIs that have been passed as non-defective in the inspection in the electrical testing for the semiconductor wafer 601 can be packaged.

Subsequently, the effects and the advantageous effects of the present embodiment will be described. In the semiconductor device 3 of the present embodiment, the package substrate 300 includes the terminals dedicated for the testing (testing-dedicated pads 903 and 905), so that the package substrate 300 is allowed to be utilized as an adapter board. Further, the pads 904 and the testing-dedicated pad 905 formed in the second surface (bump side 3b in FIG. 1) of the semiconductor device 3 are configured that only the pads 904 have the external coupling terminals 401 mounted thereon, and the testing-dedicated pad 905 has no external coupling terminal 401. This configuration prevents the testing-dedicated pad 905 from being in contact with the mother board when the mother board is installed to the second surface (bump side 3b in FIG. 1). Thus, entering unwanted electrical signal to the testing-dedicated pad and adversely affecting the operation of the semiconductor device 3 are prevented.

Therefore, according to the configuration of the semiconductor device 3, the package substrate can be directly utilized for an adapter board for inspection as it is, without a need for a change in the design of the mother board. Thus, the package substrate can be utilized for an adapter board to carry out inspections of the semiconductor device in the wafer condition with lower cost and higher adequacy.

While the preferred embodiments of the present invention have been described above in reference to the annexed figures, it should be understood that the disclosures above are presented for the purpose of illustrating the present invention, and various modifications other than that described above are also available. For example, the flip-chip device has been exemplified in the description of the present embodiment. Alternatively, the present invention may also be applied for a wire bonding device.

Also, according to the present invention, modifications described as follow are also available.

(1) A semiconductor device, comprising:
a package substrate having a first surface and a second surface; and a semiconductor element installed in said first surface of said package substrate, wherein said package substrate includes a plurality of first land pads disposed in said first surface, second land pads disposed in said second surface, and a second testing-dedicated pad disposed in said second surface, wherein said semiconductor element is electrically coupled to said first land pads, wherein an inter-pad distance for said second land pads is larger than an inter-pad distance for said first land pads, wherein said second land pad is provided with an external coupling terminal, and wherein no external coupling terminal is provided in said second testing-dedicated pad.

(2) The semiconductor device as set forth in (1), wherein said package substrate internally has a wiring, wherein said first land pad contains a first testing-dedicated pad, and wherein said first testing-dedicated pad is electrically coupled to said second testing-dedicated pad through said wiring.

(3) The semiconductor device as set forth in (1) or (2), wherein said package substrate internally has a wiring, and wherein said first land pad is electrically coupled to said second land pad through said wiring.

(4) The semiconductor device as set forth in (1) to (3), wherein said second testing-dedicated pad in said second surface is covered with an electrically insulating protective film.

(5) The semiconductor device as set forth in (1) to (4), wherein said semiconductor element is installed in said first surface of said package substrate through a bump.

(6) The semiconductor device as set forth in (1) to (5), wherein said second land pads are disposed respectively in a circumference section and a central section of said second surface, wherein a gap having a size larger than an inter-pad distance for said second land pads is formed between said circumference section and said central section, and wherein said second testing-dedicated pad is provided in said gap.

(7) The semiconductor device as set forth in (1) to (6), wherein said package substrate has a rectangular geometry, and wherein said second testing-dedicated pad is provided in at least one of corner portions of said second surface.

It is apparent that the present invention is not limited to the above embodiment, and may be modified and changed without departing from the scope and spirit of the invention.

What is claimed is:

1. A method for manufacturing a semiconductor device, comprising:

preparing two package substrates having a first surface and a second surface and having a plurality of first land pads, second land pads and a second testing-dedicated pad, said first land pads being disposed in said first surface, said second land pads being disposed in said second surface and arranged with an inter-pad distance that is larger than an inter-pad distance for said first land pad, and said second testing-dedicated pad being disposed in said second surface;

electrically coupling a semiconductor wafer with a measuring apparatus, and inspecting said semiconductor wafer with a probe card, said semiconductor wafer having a large scale integrated circuit (LSI), which is an object of an inspection, said measuring apparatus being capable of applying electrical signal to the LSI formed in said semiconductor wafer, and capable of measuring electrical characteristics of said LSI formed in said semiconductor wafer, and said probe card having one of said prepared two package substrates;

dicing said semiconductor wafer into semiconductor elements containing said LSI; and packaging said semiconductor element over the other of said prepared two package substrates, wherein said probe card includes said one of the package substrates, external coupling terminals provided in said second land pads and said second testing-dedicated pads of said one package substrate and electrically coupled to said measuring apparatus, and probes, being electrically coupled to said plurality of first land pads included in said one package substrate and being in contact with the lands formed in said semiconductor wafer, wherein said inspecting the semiconductor wafer includes:

electrically coupling said plurality of first land pads to said lands provided in said semiconductor wafer by causing said probes of said probe card into contact with the lands provided in said semiconductor wafer; and applying electrical signal from said measuring apparatus to said semiconductor wafer to measure electrical characteristics of said semiconductor wafer, and wherein said packaging the semiconductor element includes installing said semiconductor element over said first surface of said other package substrate and providing electrical coupling of said semiconductor element with the first land pad of said other package substrate; and forming an external coupling terminal over said second land pad of the other one of said package substrates, without forming an external coupling terminal over said second testing-dedicated pad of the other one of said package substrates.

2. The method for manufacturing the semiconductor device as set forth in claim 1, wherein said two package substrates internally have wirings respectively, said first land pad contains a first testing-dedicated pad, and said first testing-dedicated pad is electrically coupled to said second testing-dedicated pad through said wiring, and wherein said inspecting the semiconductor wafer includes applying a specified electrical signal to said lands of said semiconductor wafer from said measuring apparatus through said second testing-dedicated pad, said wirings, said first testing-dedicated pad and said probes.

3. The method for manufacturing the semiconductor device as set forth in claim 1, wherein said packaging the semiconductor element further includes: injecting an underfill resin into a gap between said semiconductor element and said first surface of said other package substrate.

* * * * *